Figure 1:
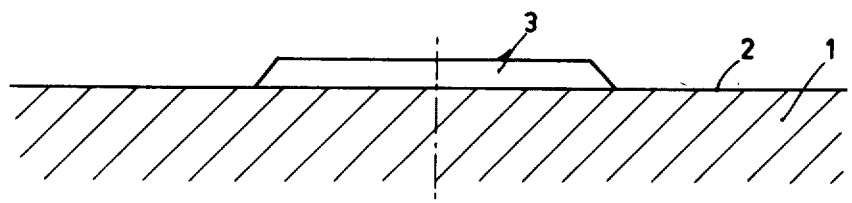

United States Patent [19]

Michel et al.

[11] 4,052,269

[45] Oct. 4, 1977

[54] METHOD OF MANUFACTURING A SEMICONDUCTOR DEVICE AND SEMICONDUCTOR DEVICE MANUFACTURED BY USING SAID METHOD

[75] Inventors: Jacques Michel, Limeil Brevannes; Michel Iost, Boussy Saint Antoine, both of France

[73] Assignee: U.S. Philips Corporation, New York, N.Y.

[21] Appl. No.: 730,939

[22] Filed: Oct. 8, 1976

[30] Foreign Application Priority Data

Oct. 15, 1975 France .............................. 75.31520

[51] Int. Cl.² .......................... C25D 5/02; C23C 15/00
[52] U.S. Cl. .................................. 204/15; 204/192 E; 204/192 EC
[58] Field of Search .............. 204/15, 192 E, 192 EC, 204/40

[56] References Cited

U.S. PATENT DOCUMENTS

| 3,669,760 | 6/1972 | Rein et al. | 204/192 E |
|---|---|---|---|
| 3,808,108 | 4/1974 | Herb et al. | 204/192 E |
| 3,880,684 | 4/1975 | Abe | 204/192 E |

*Primary Examiner*—T. M. Tufariello
*Attorney, Agent, or Firm*—Frank R. Trifari

[57] ABSTRACT

A semiconductor device of the diode type having a metal-semiconductor contact, and method of manufacturing such a device.

The cut-off frequency of such a diode may be a few Teraherz while it is possible by realizing coplanar contacts to assemble the device directly on hyperfrequency micro circuits.

The device is suitable for mixing circuits and of course also for detection purposes. The method also permits the manufacture of PIN diodes.

Application: hyperfrequency diodes. FIG. 8b.

8 Claims, 13 Drawing Figures

METHOD OF MANUFACTURING A SEMICONDUCTOR DEVICE AND SEMICONDUCTOR DEVICE MANUFACTURED BY USING SAID METHOD

The invention relates to a method of manufacturing a semiconductor device in which an electrically insulating layer is provided on the surface of a semiconduction region of one conductivity type, in which insulating layer a window is formed, after which a metal contact layer is provided on the insulating layer and in the window and forms within the window a rectifying metal-semiconductor contact on the semiconductor surface.

The invention relates in particular to a method which is suitable for the manufacture of diodes having co-planar contacts which are operative in the millimetre wave range.

The invention also relates to a semiconductor device obtained by using the said method.

The manufacture of such a type of diode having a high cut-off frequency imposes great technological problems. It is known, for example, to manufacture diodes having a Schottky micro contact, the said contact being manufacturing on a semiconductor manufactured on a semiconductor material by means of a tungsten point contact (whisker). Such a device is disclosed in U.S. Pat. No. 3,575,732. Apart, however, from the difficulty for the use of such a device as a result of the distance between the non-coplanar contacts, the said device has the drawback of showing a large inductance coefficient in the millimeter wave range which is due to the use of a whisker.

There also exist diodes which can be assembled on micro concuits and the contacts of which can be realized only the use of the technology which in expert circles is known as "beam lead technology". As an example of the said technology may be mentioned French Patent Specification No. 1,430,595. However, the cut-off frequency of said diodes is comparatively low. As a matter of fact, the conductive strip, referred to as "beam-lead", is insulated with respect to the semiconductor material by an insulating layer and in this manner an important stray capacitance is formed. As an example may also be mentioned U.S. Pat. No. 3,640,812 in which it is stated inter alia that the geometry of the manufactured device makes it difficult to increase the frequency it being difficult in face to reduce the surface area of the active zone.

Published French Patent Application No. 2,072,233 describes a method of forming an ohmic contact on semiconductor material by growing a gold or silver contact. Said French Patent Application does not relate to a semiconductor device having a high cut-off frequency. In the modified embodiment II of this French application is mentioned indeed the formation of a second contact but on the other surface of the semiconductor substrate so that the semiconductor device thus manufactured cannot be integrated.

It is the object of the method according to the invention to manufacture a semiconductor device of the type described having a considerably reduced stray capacitance and a high cut-off frequency to in the order of a Teraherz which can be readily assembled on a micro circuit. Such a method avoids the said drawbacks occurring in the known methods and is suitable, for example, for: a. the manufacture of mixing diodes which are operative in the range of the Q band (bounded by the frequencies 26 GHz - 40 GHz), in which the said diodes show only a small loss of conversion and a low noise factor. In such diodes the ratio between the cut-off frequency and the operating frequency should be approximately 30. b. the manufacture of other diodes for signal processing (detection diodes, PIN diodes and so on) destined for hyperfrequency devices, c. all kinds of other applications for which a high cut-off frequency is necessary or desired.

According to the invention, a method of the kind mentioned in the preamble is characterized in that the insulating layer is provided in the form of at least one island, that a metal masking layer is grown electrolytically on the parts of the semiconductor surface not covered by the island until it extends over the edge of the island and partly over the insulating layer cut does not cover a small surface part of the island, that the insulating layer is then removed at the area of the uncovered surface part by an ion bombardment so as to form the window, the masking layer being removed at most only partly, and that the masking layer is then removed entirely and the metal contact layer is provided.

An important preferred embodiment is characterized in that the part of the semiconductor surface not present below the island is covered electrolytically by an electrode layer which forms a non-rectifying contact on the semiconductor surface.

The diodes manufactured according to this method have the following advantages:

The dimensions of the resulting metal-semiconductor contact are very small, which considerably reduces stray effects (inductances, capacitances, stray resistances) which can detrimentally influence the cut-off frequency Fc of the device according to the known formula $Fc = K/RC$, wherein K is a constant, R is the sum of the resistances used and C is the sum of the stray capacitances.

Since the ohmic contact covers the whole surface of the semiconductor substrate not covered by silicon oxide, the contact itself hence protects the surface and better collects the electric charge carriers.

The assembly of such diodes of a micro circuit does not present any problem.

A further preferred embodiment is characterized in that an electrically insulating masking layer is provided on the metal contact layer and does not cover the contact layer in the window and within a region around the window, after which a further metal layer, preferably of gold, is grown electrolytically on said uncovered region, after which the insulating masking layer and the underlying part of the contact layer are removed.

The diode obtained according to the said preferred embodiment has a comparatively high power density, for the solid contact member fulfils the part of a cooling member. The contact member which forms a small projecting part facilitates the assembly on the micro circuit at the site where the diode will be provided, the other contact of the diode which is an ohmic contact being formed by a conductive strip the height of which corresponds to that of the contact member. Finally, as a result of the small dimensions of the contact, the contact does not cause an augmentation of the inevitable stray effects.

According to a modified embodiment, the method according to the invention is advantageously carried out so that after removing the metal masking layer and prior to providing the metal contact layer the part of the semiconductor region not covered by the island is etched away partly, etching being continued until a freely projecting edge portion of the island has been obtained.

In this manner it is possible indeed to deliberately vary the extent of the active zone and hence to manufacture just the type of diode which is necessary for a given circuit.

The invention will now be described in greater detail with reference to a drawing, in which:

FIGS. 1 to 5 relate to successive stages in the manufacture of a diode according to the invention which is obtained by using the method according to the invention, FIGS. 6a to 9a relate to successive stages in the manufacture of a diode obtained by using a first modified embodiment of the method according to the invention, while FIGS. 6b to 9b relate to a second modified embodiment of the method according to the invention.

The figures are diagrammatic and not drawn to scale. Corresponding parts are as a rule referred to by the same reference numerals.

Via a known method, for example by thermal oxidation, a layer of silicon oxide is first provided on the whole surface 2 of a semiconductor plate 1 in which several diodes will be formed simultaneously. Parts are then etched out of the silicon oxide layer via a conventional photoetching method, as shown in FIG. 1, in which, for example, a negative photosensitive lacquer is used, leaving a circular Part 3.

The circular parts 3 which are produced by etching the previously provided silicon oxide layer will have a thickness which depends on the maximum permitted stray parameters (capacitance and stray resistances), said thickness being, for example, from 1 micron to 5 microns.

Figure 2:
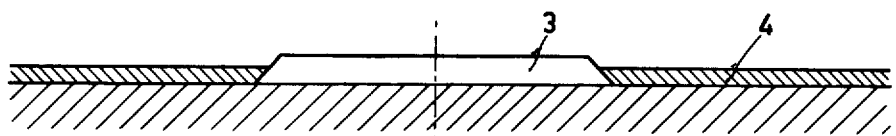

FIG. 2 shows a metal layer 4 electrolytically provided on the surface of the semiconductor plate 1, the metal being, for example, gold or an alloy of gold and tin. The metal will not deposit on the silicon oxide parts 3, since this material is insulating.

Figure 3:
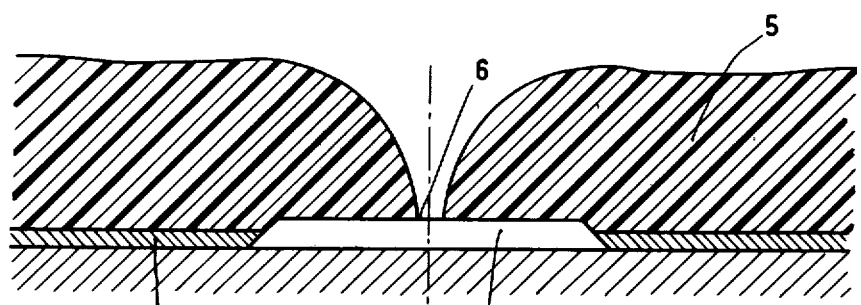
Figure 4:
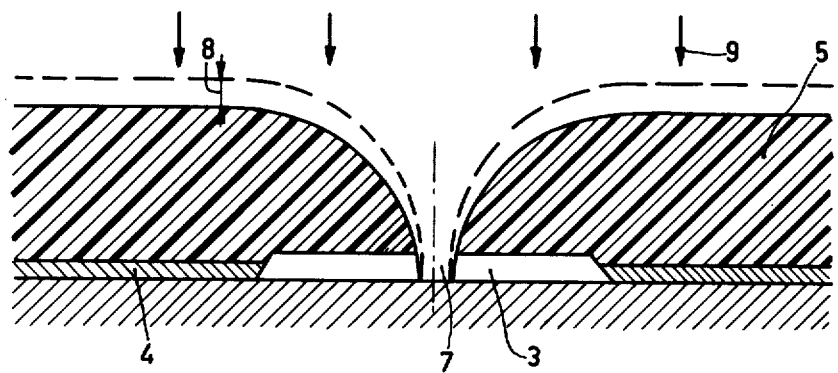

The thickness of the metal thus provided may be from 0.5 $\mu$ to 2 $\mu$. FIG. 3 shows an electrolytically further metal layer 5, for example a nickel layer. In this manner, the layer 5 is automatically centred with respect to the silicon oxide part 3. Due to the face that the part 3 is insulating, the metal will deposit only slowly thereon and will start near the edge thereof. In addition, due to the fact that the periphery oxide Part 3 is circular, a small circular zone 6 will remain at the end of the dectrolytic growth, which zone is situated in the centre of the Part 3 and on which the metal layer 5 is not deposited.

The provided nickel layer 5 (see FIG. 4) is then subjected to an ion bombardment which will form a window 7 of a very small diameter (in the order of, for example, 2$\mu$) and with certain properties in the centre of the silicon oxide part 3. The nickel layer 5 protects the remainder of the surface of the semiconductor material against the ion bombardment.

Nevertheless, the nickel will to a certain extent be attacked by the bomardment over a depth which is denoted in the figure by 8.

The bombardment is carried out by means of argon ions 9 which are first accelerated (accelerating voltage approximately 1000 V) and then neutralized so as to counteract in this manner secondary dispersion and accumulation effects of the charges on the substrate.

Figure 5:
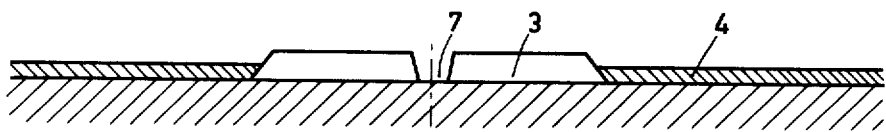

FIG. 5 shows the next step in the manufacture, namely the etching away of the nickel layer 5 via a known chemical method.

It should be ensured that the semiconductor material is not attacked. This can be avoided by using suitable and sufficiently selective chemical baths and reducing the etching time as much as possible.

As shown in FIG. 5, after said step in the manufacture a layer 4 of alloyed gold and tin or a layer of gold alone remains on the semiconductor substrate, while the silicon oxide part 3 has a central aperture.

Figure 6A:
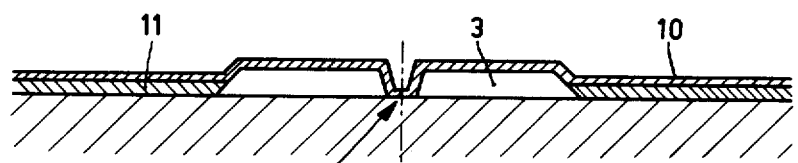
Figure 7A:
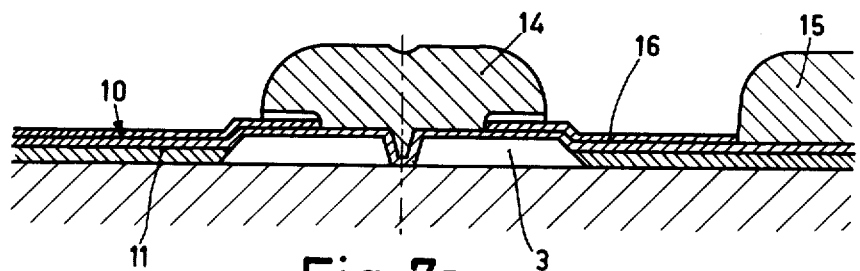

Beginning with FIG. 6, two modified embodiments of the method are shown:

In the case of FIG. 6a (modified embodiment I) a metal-semiconductor contact was obtained by a contact layer 10 (for example, a double-layer contact of titanium and gold) on the whole surface of the semiconductor plate. This contact layer 10 can be obtained via various methods: cathode sputtering at high frequency, vapour deposition, and so on, in accordance with the various materials chosen. The thickness of the layer 10 may be from 0.2$\mu$ to 1$\mu$. The metal-semiconductor contact will show a very small surface area and form a diode which is denoted in the figures by D. According to a first modified embodiment of the method the electrode layer 11 on which the ohmic contact will be realized in the present case will preferably be manufactured from gold, or an alloy of gold and tin.

Figure 6B:
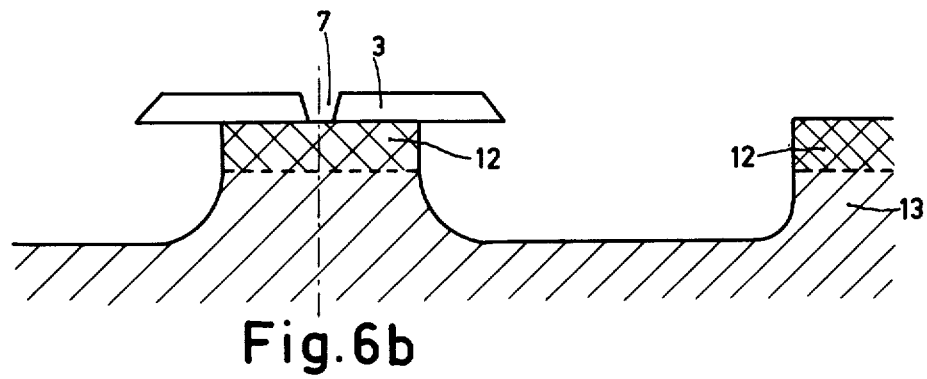

According to a second modified embodiment, first the metal layer 4 of FIG. 5 is removed chemically, after which the structure shown in FIG. 6b is realized by providing a protective lacquer layer on a given part of the surface of the semiconductor material, a further unprotected part of the surface being attacked by a chemical bath in such manner that a mushroom-like structure is finally obtained having beside it a wall the height of which is equal to that of the said structure.

As shown in FIG. 6b after the said operation on the one hand only by perforated silicon oxide part 3 remains which projects above a first layer 12 of the substrate first said layer 12 being preferably doped comparatively weakly, and on the other hand an upright part 13 of semiconductor material remains of which the surface layer 12 is thus doped in the same manner. The following parts are then simultaneously grown electrolytically (see FIG. 7a):

a gold contact member 14 located above the window 7 provided in the silicon oxide part 3, said contact member 14 enabling the connection of the metal-semiconductor contact to one of the sides of the micro circuit on which the semiconductor device according to the invention is to be assembled, and a conductive strip 15 (beam lead) which is also of gold and will form the second ohmic contact.

The gold layer is not deposited on the remainder of the metal surface due to the presence of a photosensitive lacquer layer 16.

Figure 8A:
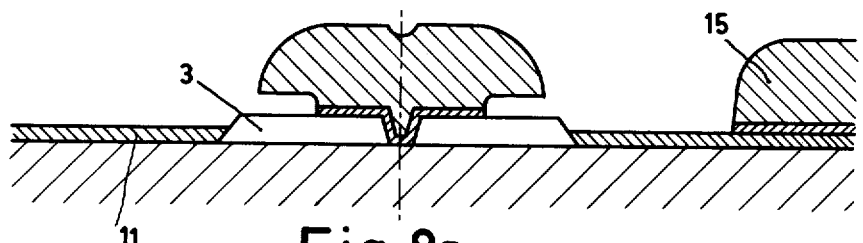
Figure 8B:
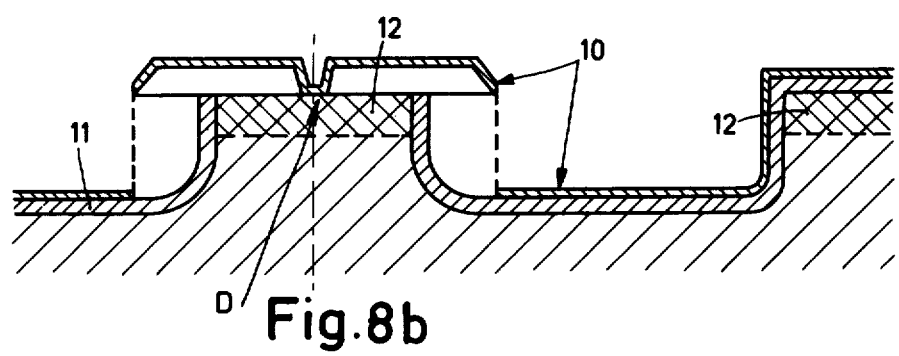

After removing the lacquer layer 16 there is removed the excess part of the metal layer 10 which has been used to manufacture the metal-semiconductor contact shown in FIG. 8a. For that purpose the photosensitive lacquer layer 16 is removed and the gold-titanium layer is selectively etched away. In this manner the metal-semiconductor contact and the ohmic contact are manufactured.

Figure 7B:
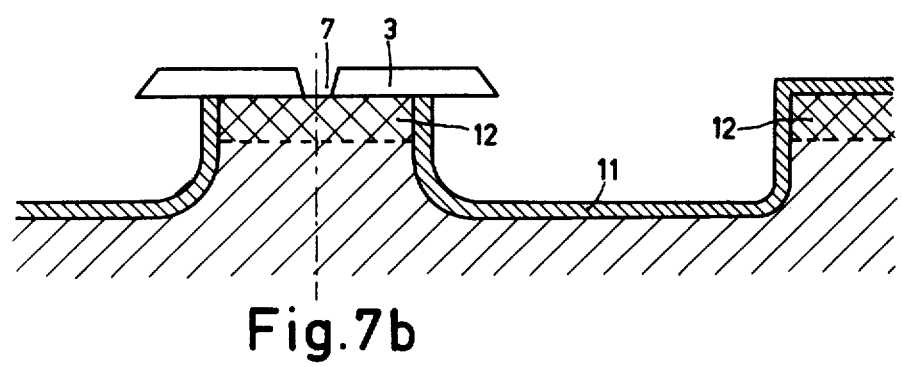

FIG. 7b shows the device which is obtained after providing — in this case electrolytically — a layer 11 of a gold-tin alloy on the whole surface of the semiconductor substrate. In this manner the ohmic contact 11 is provided on said whole surface so that it is situated nearer to the active zone of the semiconductor device in which due to said symmetrical geometrical shape a radial collection of the charge carriers is achieved around the whole metal-semiconductor contact which is situated in the centre of the silicon oxide part, as in the first modified embodiment.

The active zone of the semiconductor device manufactured according to this method can be reduced by the use of a multi-layer substrate. For example, in the case of a two-layer substrate a layer may be provided in the immediate proximity of the metal-semiconductor contact, said layer being denoted by 12 in the figures and the doping and the thickness of which being adapted to the anticipated use of the semiconductor device according to the invention. A highly doped layer 13 (FIG. 6b) is provided in the substrate at a larger depth so as to reduce the stray series resistance of the device.

The layer 13 has a doping level of, for example, between $10^{17}$ and $5 10^{18}$ atoms per $cm^3$, the layer 12, for example, has a doping level of between $10^{14}$ and $10^{16}$ atoms per $cm^3$ and a thickness between, for example, 0.5 micron and 10 microns.

FIG. 8b shows the formation of the metal-semiconductor contact 10. As in the case of FIG. 6a, the metal-semiconductor contact in this case was realized via the provision in a vacuum of titanium and gold on the whole surface of the semiconductor substrate.

It may be noted that the stray series resistance is considerably reduced owing to the fact that according to this modified embodiment a metal-semiconductor contact is obtained which is situated in the immediate proximity of an ohmic contact.

Figure 9A:
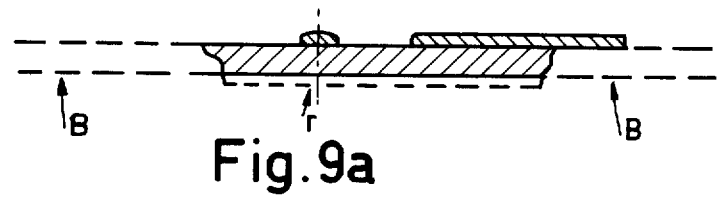
Figure 9B:
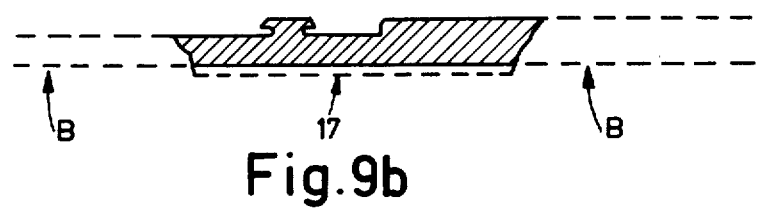

Finally, the semiconductor devices thus manufactured are severed, for example by a chemical etching treatment, as shown in FIGS. 9a and 9b.

A photosensitive lacquer layer 17 serves as a protection of the lower part of the semiconductor substrate, otherwise while covering the frontside of the semiconductor plate; the material between the individual devices is etched away by means of a chemical bath B. In this manner it is possible to assemble each of the diodes thus manufactured on a hyperfrequency micro circuit.

The doping concentrations, the diameters of the aperture and the layer thicknesses which are stated in this specification are, of course, given by way of example only and may in no case be considered as a limitation of the use of the invention.

What is claimed is:

1. A method of manufacturing a semiconductor device, comprising the steps of:
    a. providing a semiconductor body comprising a surface and a semiconductor region of a certain conductivity type located at said surface;
    b. providing on said surface at said semiconductor region an electrically insulating layer comprising at least one island,
    c. forming a window in said insulating layer by the steps of:
        i. electrolytically growing a metal masking layer on the parts of said semiconductor surface not covered by said island until said masking layer over the edge of said insulating island and partly over said insulating island so that a small surface part of said insulating island is uncovered,
        ii. then removing said insulating layer at the area of said surface part by ion bombardment so as to form said window, removing said masking layer at most only partly by said ion bombardment, and
        iii. removing entirely said masking layer,
    d. providing a metal contact layer on said insulating layer and in said window, said contact layer portion located within said window forming a rectifying metal-semiconductor contact with said semiconductor surface.

2. A method as in claim 1, wherein prior to providing said masking layer the part of said semiconductor surface not covered by said island is covered electrolytically by a metal auxiliary layer which does not extend on said insulating layer and forms a non-rectifying contact with said semiconductor surface.

3. The method as in claim 1, wherein an electrically insulating masking layer is provided on said metal contact layer and does not cover said contact layer in said window and within a region around said window, after which a further metal layer is grown electrolytically on said uncovered region of said contact layer, after which said insulating masking layer and the underlying part of said contact layer are removed.

4. The method as in claim 3, wherein said further metal layer is of gold.

5. A method as in claim 3, wherein said further metal layer is also grown on at least a part of said electrode layer.

6. A method as in claim 5, wherein after removing said metal masking layer and prior to providing said metal contact layer, the part of said semiconductor region not covered by said island is etched away partly, etching being continued until a freely projecting edge portion of said island has been obtained.

7. A method as in claim 6, wherein said electrode layer is provided at least partly on the etched part of said semiconductor region.

8. A method as in claim 7, wherein said uncovered part of said semiconductor region is etched only over a part of its surface and said electrode layer extends on a non-etched edge portion of said semiconductor body.

* * * * *